United States Patent [19]

Ceintrey

[11] 4,252,601

[45] Feb. 24, 1981

[54] WRITING LIQUID FOR USE WITH AN OPAQUE RECORDING MATERIAL FOR FORMING TRANSPARENCIES FOR OVERHEAD PROJECTION AND THE LIKE

[75] Inventor: Claude Ceintrey, Paris, France

[73] Assignee: La Cellophane, Paris, France

[21] Appl. No.: 912,546

[22] Filed: Jun. 5, 1978

[30] Foreign Application Priority Data

Mar. 1, 1978 [FR] France ................................ 78 05816

[51] Int. Cl.$^3$ ...................... B44C 1/22; H01L 21/312; A45C 11/34; B65D 85/00

[52] U.S. Cl. ..................................... 156/655; 346/1.1; 346/135.1; 106/19; 106/311; 206/214; 206/215; 252/79.1; 252/364; 427/161

[58] Field of Search ............................. 346/1.1, 135.1; 428/409, 913, 918; 427/161, 148; 156/655; 106/19, 311; 206/214, 215; 252/79.1, 364

[56] References Cited

U.S. PATENT DOCUMENTS

| | | | |
|---|---|---|---|
| 2,962,382 | 11/1960 | Ives | 428/918 X |
| 3,014,301 | 12/1961 | Grupe | 428/409 |
| 3,147,062 | 9/1964 | Glenn | 346/135 X |
| 3,180,752 | 4/1965 | Bollinger et al. | 428/918 X |
| 3,265,524 | 8/1966 | Echangaray | 346/135 X |
| 3,320,089 | 5/1967 | Bourgeois | 346/135 |
| 3,642,475 | 2/1972 | Vrancken et al. | 96/35 |

*Primary Examiner*—Michael R. Lusignan

*Attorney, Agent, or Firm*—Sherman & Shalloway

[57] ABSTRACT

Transparencies for overhead projection are formed in which the information to be displayed is in the form of transparent lines, or other geometric patterns, on an opaque background. The transparent lines are formed on an opaque layer of a recording material formed from a clear or colored transparency on which the opaque layer is firmly adhered. The opaque layer is formed from finely divided organic styrene resin pigment uniformly distributed in a film-forming binder resin. The writing liquid is formed from a solvent for the organic styrene resin pigment. When the writing liquid is applied to the opaque layer using a suitable writing instrument, such as a pen, the opaque layer immediately becomes transparent where it is contacted with the solvent. The potential toxicity of the solvent (or solvent vapors) is eliminated and writing speeds may be increased by mixing a chlorofluoroalkane of from 1 to 3 carbon atoms with the solvent.

14 Claims, No Drawings

WRITING LIQUID FOR USE WITH AN OPAQUE RECORDING MATERIAL FOR FORMING TRANSPARENCIES FOR OVERHEAD PROJECTION AND THE LIKE

BACKGROUND OF THE INVENTION

1. Field of the Invention

This invention relates to writing liquids for writing on opaque recording materials to form transparent lines against an opaque background, as well as to unique combinations of writing liquid and opaque recording material for forming transparencies to be used with overhead projection machines and the like as well as to a method of writing in the form of transparent lines on an opaque recording material.

2. Discussion of the Prior Art

U.S. Pat. No. 3,014,301 to W. F. Grupe relates to a recording material, referred to as a recording chart or chart medium, for use in recording units with a heated or a pressure stylus, and/or a pen containing a solvent. The chart medium is made with a transparent film backing upon which is deposited a white, opaque coating which is heat, pressure and solvent sensitive. The coating is formed from an unstable solution of nitrocellulose in acetone (a solvent) and xylol (a non-solvent). The whiteness and opacity results from the acetone evaporating first leaving a high percentage of xylol and nitrocellulose in solution, from which the nitrocellulose is precipitated as a white solid. The chart is transparentized by "printing" the opaque layer with a solvent such as Cellosolve or carbitol acetate from a solvent dispensing pen. A transparent dye can be added to the solvent to form transparent lines color dyed but photographically transparent so that it may be used as a negative for photographic reproduction or as a positive transparency for projection onto screens or other medium. The chart medium can be used, for example, for preparing graphs with conventional pen-operated machines.

A similar sheet recording material which is sensitive to pressure is disclosed by R. S. Ives in U.S. Pat. No. 2,962,382, except that water replaces xylol as the high boiling non-solvent and various film-forming polymeric materials such as cellulose acetate, ethyl cellulose and polyethyl methacrylate are disclosed in addition to nitrocellulose as the opaque material. This patent also discloses methyl ethyl ketone and methyl alcohol, in addition to acetone as suitable volatile solvents for the polymeric materials. However, the opaque coatings taught by Ives require large amounts of surfactant or a combination of surfactant and waxy lubricant to produce useful pressure-sensitive materials.

While the recording materials described in the above patents provide satisfactory transparencies in many cases they suffer from the drawback that it is very difficult to obtain uniform opaque coatings by depositing a layer of polymeric material from an unstable mixture of volatile solvent and high-boiling non-solvent. Precise control of the rate of evaporation of the volatile solvent is necessary to obtain opaque coatings and uniformity of the opacity over the entire surface. Reproducibility from sheet to sheet is also difficult. Furthermore, the degree of opacity with the polymer/solvent/non-solvent systems of these patents is generally not as high as desireable for good contrast between the transparent film backing sheet and the opaque coating layer.

A heat sensitive recording sheet material of improved properties, including opacity, has been sold by the Minnesota Mining and Manufacturing (3M) Co. under the designation Thermofax Transparency #528. As the name suggests, this sheet material is sold for use for making transparencies with a Thermofax infrared recording machine and includes an opaque layer of a styrene resin, acrylic resin and silica on a transparent polystyrene backing sheet. There is no indication by the 3M Co. that this recording material can be transparentized with a solvent for the styrene resin.

SUMMARY OF THE INVENTION

It has now been found that opaque coatings can be simply prepared from an aqueous dispersion of finely divided particles of a styrene resin with a film-forming binder and that when such an opaque coating is deposited on a transparent backing sheet, positive transparencies for projection of images of the transparent "writing" or negative transparencies for photographic reproduction can be obtained by application of a solvent for the styrene resin particles to the opaque coating.

Accordingly, the present invention provides, in one aspect, an information recording kit for making transparencies for projection of information or for making photographic negatives for reproduction, which system includes an opaque recording material formed by depositing an opaque layer of finely divided particulate styrene resin pigment uniformly distributed throughout a film-forming resin binder for adhering the opaque layer to one surface of a transparent (clear or colored) backing sheet, a writing liquid which is a solvent for the styrene resin pigment particles, and writing means, such as a solvent dispensing pen, for applying the writing liquid on the opaque layer of the recording material, whereby when the writing liquid is applied to the opaque layer according to a pattern of information the opaque layer becomes photographically transparent (transparent to visible light) according to the pattern. The pattern may, for example, be a writing, drawing, graph, etc.

The present invention also provides a method for writing (recording information) for projection, display or reproduction on an opaque recording material in the form of a transparent pattern (corresponding to the information to be recorded) which comprises applying, according to the pattern, to an opaque layer of a finely divided styrene resin pigment uniformly distributed throughout a film-forming resin binder, adhered to a transparent backing sheet, a writing liquid which is a solvent for the opaque styrene resin pigment, whereby the opaque layer becomes transparent where contacted by the solvent.

While very satisfactory transparencies are provided by the information recording kit of this invention, it is believed that its commercialization may be limited since the solvents, such as methyl ethyl ketone, of the styrene resin opacifying pigment particles are generally toxic and flammable and also have a disagreeable odor. Consequently the use of these solvents in public places such as schools and libraries is severly limited and, in fact, in many localities their use is strictly forbidden by law.

Attempts by the inventor to overcome this problem by replacing part of the styrene resin solvent of the writing liquid with non-toxic liquids, such as ethanol and acetone, which are well known solvents for inks, met with failure since the mixed solvent/non-solvent, as shown in the comparative examples provided below, did not transparentize, or only very slightly transparentized, the opaque styrene resin pigment containing layer.

However, after continued research the inventor suprisingly discovered that the problems of the styrene resin solvent writing liquid could be completely or substantially completely avoided by a writing liquid formed from a mixture of the solvent for the opacifying styrene resin pigment particles and one or more fluorochloroalkanes at a weight ratio of solvent to fluorochloroalkane of from 10:90 to 80:20. In general, the suitable fluorochloroalkanes contain from 1 to 3 carbon atoms, i.e. fluorochloromethane, fluorochloroethane and fluorochloropropane and have boiling points greater than 0° C. Furthermore, many of the writing liquids according to this invention are additionally more effective than the solvent alone.

DETAILED DESCRIPTION OF THE INVENTION AND PREFERRED EMBODIMENTS

The opaque recording materials used in the information recording kit of the present invention are formed from aqueous dispersion of styrene resins which are characterized by being non-film forming at under 65° C. (i.e. they have a minimum film-forming temperature—MFFT—of 65° C.) and having an average particle size in the range of about 0.2 to 1.0 micron. For average particle sizes under 0.2 micron the degree of opacity of the opaque layer is insufficient. For average particle sizes greater than 1.0 micron, the particles tend to precipitate or drop out. Suitable aqueous dispersions of styrene resins meeting these critical requirements are commercially available from a variety of sources and techniques for their preparation are well known in the art.

The styrene resin can be a polystyrene homopolymer or a copolymer of styrene with up to 30 percent by weight of one or more vinyl monomers which are copolymerizeable with styrene, such as butadiene, acrylonitrile, acrylic acid, methacrylic acid, acrylic esters, e.g. ethyl acrylate and butyl acrylate, methacrylic esters, e.g. methyl methacrylate and ethyl methacrylate, and the like.

The other essential component of the opaque coating is the film-forming resin binder, for example, polyvinylidene chloride, acrylic resins, styrene-acrylic resins, and the like.

The opaque layer is formed by mixing the aqueous dispersion of the finely divided styrene resin pigments with an aqueous dispersion of particles of the film-forming resin binder, depositing the mixture on the transparent backing sheet and drying under moderate temperature conditions which will allow the binder particles to form a film but which will not allow the pigment particles to coalesce. The proportion of the pigment particles to the binder particles should be selected to provide an opaque layer whose degree of opacity is at least 60% as measured by a photovolt reflectometer. By "degree of opacity" is meant the percentage of visible light which will be absorbed by the layer. Accordingly, the opaque layers useful for this invention will transmit less than 40% of the total incident light. It is also essential that the transparent marking formed according to this invention, have a degree of transparency of at least 90%, i.e. transmit 90% or more of incident visible light. Preferably, the weight ratio of the styrene resin pigment to film-forming binder is about 1:1 to about 9:1. At less than about 50% of styrene resin pigment particles the degree of opacity is insufficient while at amounts of pigment particles in excess of 90% by weight, it is not possible to obtain coating of satisfactory adherence to the transparent backing sheet.

Substantially any transparent backing sheet can be used for forming the recording material. The support film can be any transparent natural or synthetic material, such as polyethylene, polypropylene, cellulose acetate, polyvinylalcohol, polyesters, polystyrene, and the like. Furthermore, the backing sheet can be dyed with a transparent dyestuff on the surface or throughout the mass. The adhesion of the opaque layer to the backing sheet can be improved by using an anchoring layer, e.g. acrylic resin with the backing sheet or by subjecting the backing sheet to corona discharge. These techniques are well known in the art.

The opaque coating will be deposited on the transparent backing sheet at a rate of, on a dry matter basis, from about 6 to 20 g/m$^2$, preferably from 8 to 14 g/m$^2$. The thickness of the opaque coating layer should be at most 25 microns, preferably no more than about 20 microns, since for greater thicknesses it becomes difficult to completely transparentize the opaque layer with the writing liquid since the solvent cannot readily penetrate the entire layer.

The opaque coating can also include small amounts of other ingredients without effecting the opacity of the opaque coating nor the transparency of the transparentized coating after contact with the writing liquid. For example, optical brighteners in amounts up to 3% by weight of the coating and inorganic pigments, such as silica, $CaCO_3$, $TiO_2$, etc., in amounts of less than about 10% by weight of the total opaque coating can be used.

Any of the known solvents for styrene resins can be used in the writing liquid to transparentize the opaque coating layer. Among the solvents mention can be made of, for example, ketones of the formula

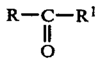

where R and R$^1$ may be the same or different and represent alkyl groups of 1 to 4 carbon atoms, except that R and R$^1$ cannot both be methyl (since acetone is not a solvent for styrene resins); alkyl esters of the formula

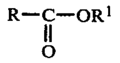

where R and R$^1$ are as defined above; the Cellosolve esters, chlorinated solvents, benzene, toluene, xylene, dimethylformamide, dimethylacetamide, tetrahydrofuran, and the like. Among these, preferred solvents include methylethyl ketone, methylene chloride, toluene ethyl acetate, methyl isobutyl ketone or butyl acetate.

However, while satisfactory transparencies can be made with any of these solvents alone as the writing liquid these solvents are generally toxic, flammable and/or malodorous.

Surprisingly, although no theory has been elucidated, it has now been found that by mixing the solvent with one or more fluorochloroalkanes of the following formula:

$$(CF_xCl_yH_z)-(CF_{x'}Cl_{y'}H_{z'})_{\overline{n}}(CF_{x''}Cl_{y''}H_{z''})_m$$

wherein $n=0$ or 1, $x, x', x''=0, 1, 2$ or 3

$y, y', y''=0, 1, 2$ or 3

$z, z', z''=0, 1$ or 2 when $$n=0 \text{ then } m=0 \text{ and } x+y+z=4,$$

when $$n=1 \text{ then } m=0 \text{ or } 1,$$

when $$n=1 \text{ and } m=0 \text{ then } x+y+z=x'+y'+z'=3$$

and when $$n=1 \text{ and } m=1 \text{ then } x+y+z=x''+y''+z''=3$$

and $$x'+y'+z'=2$$

at a weight ratio of solvent to chlorofluoroalkane of from 10:90 to 80:20, the toxicity, flammability and malodor of the solvent can be avoided without adversely effecting the solvent action of the writing liquid. The fluorochloroalkanes are described in more detail, for example, in "Encyclopedia of Chemical Technology" Vol 9, p. 743ff. When the mixture contains less than 20% of fluorochloroalkane, the mixture is also flammable and therefore provides no advantage over the solvent alone. When the mixture includes more than 90% of fluorochloroalkane no advantages are obtained over the solvent alone and in fact, the effectiveness tends to decrease. Most preferably the fluorochloroalkane is used in an amount of 20 to 50% by weight of the total mixture.

It was most surprising to discover that even though the fluorochloroalkanes are not solvents for the styrene resin pigments used in this invention, the mixed solvent/fluorochloroalkane writing liquid generally exhibit an overall greater effectiveness than the solvent alone. In particular, the writing speed, which is especially important with automatic pen machines, is increased with many of the mixtures of this invention.

In the above formula defining the fluorochloroalkane additives it is preferred to select those in which $x \leqq y$ since these compounds are liquid at normal temperatures. However, solid additives can also be used since the fluorochloroalkanes will be soluble in the solvent selected for the particular styrene resin pigment. Also, fluorochloroalkanes such as $CHCl_2F$, $CH_2Cl—CF_3$ and $CCl_2F—CClF_2$ which are gases at room temperature can also be used since they too are soluble or form azeotropes with the writing liquid solvent. For the normally solid and normally gaseous fluorochloroalkanes, it is generally preferred to use mixtures with normally liquid fluorochloroalkanes since the former are generally soluble in the latter. The proportions of solvent and fluorochloroalkane, within the above prescribed limits should preferably be selected to achieve viscosities and volatilities which are compatible with the particular writing instrument, which may be a conventional ball point or tubular manual pen or a solvent dispensing point associated with an automatic recording device.

Preferred fluorochloroalkane compounds include, for example, the following:

$CFCl_3$, $CHCl_2F$, $CCl_2F—CCl_2—CClF_2$, $CCl_2F—CClF_2$, $CCl_3—CF_3$, $CClF_2—CClF_2$, and $CH_2Cl—CF_3$.

Because of there commercial availability $CCl_3F$ (F11;l ), $CCl_2F—CCl_2F$ (F112) and $CCl_2F—CClF_2$ (F113) are especially preferred.

When it is desired to prepare transparent markings having a particular color, for example red, it is possible to mix a dye of the desired hue in the writing liquid. Dyes sold under the trademarks NEOZAPON (products of the BASF Company) and CERES (products of the Bayer Company) can be mentioned as dyes which easily mix with most of the solvents for styrene resins and which will not adversely effect the desired characteristics of the writing liquid or transparentized recording material.

The following non-limiting examples are presented to provide a better understanding of the present invention.

EXAMPLE 1

There is deposited at a rate of 10 g/m² on a transparent polyester film sold under the trademark TERPHANE (a trademark of La Cellophane), with a thickness of 75 microns and coated with an anchoring layer, the following composition:

| | |
|---|---|
| Rhodopas S 014 (aqueous dispersion, 50% dry solids polystyrene 0.5 microns particles, avg., of the Societe Rhone Poulenc) | 10 g |
| IXAN 91 (55% dry aqueous dispersion PVDC of the Solvay Company) | 3 g |

The mixture is dried gently under 90° C. to form the opaque coating having an opacity of 60% measured with a PHOTOVOLT type 670 reflectometer.

This recording material is written on with a tubular point pen sold under the tradename STAEDTLER type Mars 707 K filled with methyl ethyl ketone.

There is obtained a perfectly transparent line which on projection is white on a black background.

If there is added to the solvent a blue dye such as NEOZAPON blue, a blue line on a black background is obtained directly; when the NEOZAPON blue is replaced with yellow organol PC sold by the Ugine Kuhlmann Company a yellow line is obtained.

The same results are obtained when the methyl ethyl ketone is replaced by methyl isobutyl ketone, ethyl acetate, butyl acetate, toluene or methylene chloride.

EXAMPLE 2

On a 50-micron film sold under the trademark TERPHANE are deposited a mixture of:

| | |
|---|---|
| Pliolite Latex 151 (Goodyear styrene-butadiene copolymer) | 10 g |
| Diofan 3033 (PVDC of BASF) | 3 g |

After drying a product fairly equivalent to that described in example 1 is obtained.

For writing, it is possible to operate exactly as in example 1 or again by providing the body of a writing felt of the ONYX MARKER type of the Baignol and Farjon Company with any of the solvents cited in example 1 with equivalent results, except the width of the writing is larger.

EXAMPLES 3 to 8

The following composition is deposited at a rate of 10 g/$m^2$ on a transparent polyester film 75 microns thick, sold under the trademark TERPHANE, and coated with an anchoring layer:

| | |
|---|---|
| Rhodopas S 051 (polystyrene of the Rhone-Poulenc Co.) | 10 g |
| IXAN 91 (polyvinylidene chloride of the Solvay Co.) | 3 g |

On this material the data writing is performed at a speed of about 5 cm/s with the same type pen as used in example 1. The following results are then obtained:

| EX. NO. | COMPOSITION OF WRITING LIQUID | | RESULTS OBTAINED |
|---|---|---|---|
| 3 | Methyl ethyl ketone | 5 g | Transparent line |
| | $CF Cl_2$—$C Cl F_2$ | 10 g | |
| 4 | Ethyl acetate | 5 g | Transparent line |
| | $CF Cl_2$—$C Cl F_2$ | 12 g | |
| 5 | Methyl ethyl ketone | 5 g | |
| | $CF Cl_2$—$C Cl F_2$ | 7 g | Transparent line |
| | $CF Cl_2$—$CF Cl_2$ | 7 g | |
| 6 | Ethyl acetate | 5 g | |
| | $CF Cl_2$—$C Cl F_2$ | 7 g | Transparent line |
| | $CF Cl_2$—$C Cl_2 F$ | 8 g | |
| 7 | Methyl ethyl ketone | 3 g | |
| | $CF Cl_2$—$C Cl F_2$ | 1 g | Transparent line |
| | $CF Cl_2$—$CF Cl_2$ | 10 g | |
| 8 | Ethyl acetate | 5 g | |
| | $CF Cl_2$—$C Cl F_2$ | 8 g | Transparent line |
| | $CF Cl_2$—$CF Cl_2$ | 14 g | |

COMPARATIVE EXAMPLES 1 to 4

By way of comparison and to bring out the surprising character of the invention, mixtures such as those described above were made but by replacing the fluorochloroalkane with a known solvent in the field of ink components, of slight toxicity and usually used in writing pens, particularly for overhead projections, etc.

| Comp. Ex. No. | Mixtures Used | | Results Obtained |
|---|---|---|---|
| 1 | Methyl ethyl ketone | 5 g | Line hardly made transparent |
| | Ethanol | 1 g | |
| 2 | Methyl ethyl ketone | 5 g | Barely perceptible line |
| | Ethanol | 2 g | |
| 3 | Methyl ethyl ketone | 5 g | No transparency made |
| | Ethanol | 3 g | |
| 4 | Methyl ethyl ketone | 5 g | Barely perceptible line |
| | Acetone | 1 g | |

EXAMPLES 9 to 21

The writing support described in Example 2 is written on.

The maximum passing speed of the support is defined as being that which gives a transparency of the line equal to that of the uncoated support, measured on a photovolt reflectometer.

| Ex. No. | Writing Liquid Used | | Maximum Passing Speed of the Writing Support CM/S |
|---|---|---|---|
| 9 | Methylene chloride | 100% | 3.33 |
| 10 | Methylene chloride | 65% by | |

-continued

| Ex. No. | Writing Liquid Used | | Maximum Passing Speed of the Writing Support CM/S |
|---|---|---|---|
| | $C Cl_2 F$—$C Cl_2 F$ | weight | |
| | (tradename: F 112) | 30% | 4 |
| | $Cl_2 F$—$C Cl F_2$ | | |
| | (tradename: F113) | 5% | |
| 11 | Methyl ethyl ketone | 100% | 20 |
| 12 | Methyl ethyl ketone | 73% | |
| | F 112 | | 25 |
| | F 113 | 3% | |
| 13 | Methyl ethyl ketone | 73% | |
| | F 112 | 27% | 28 |
| 14 | Methyl ethyl ketone | 65% | 10 |
| | F 112 | 35% | |
| 15 | Methyl ethyl ketone | 25% | 5 |
| | F 112 | 75% | |
| 16 | Toluene | 100% | 24 |
| 17 | Toluene | 75% | 27 |
| | F 112 | 25% | |
| 18 | Toluene | 61% | 21 |
| | F 112 | 39% | |
| 19 | Methyl ethyl ketone | 75% | 25 |
| | $CF Cl_3$ (tradename F II) | 25% | |
| 20 | Methyl ethyle ketone | 35% | 17 |
| | $CF Cl_3$ (tradename F II) | 65% | |
| 21 | Methyl ethyl ketone | 25% | |
| | F II | 75% | |

The above examples show that the mixtures of solvents and fluorochloroalkanes can have such an interaction that the writing speed of the mixture is greater than that of the solvent alone.

There are cases when the mixture containing 75% fluorochloroalkane still allows a very high writing speed.

It is quite evident that it is also possible to add the necessary additives in using the writing liquid to achieve, for example, felt tip pens in which the liquid does not evaporate too quickly: by way of non-limiting example there can be cited glycerin, ethylene glycol, etc.

I claim:

1. An information recording kit for making transparencies for projection of information or for making photographic negatives for reproductions comprising an opaque recording material, a writing liquid for recording information on the recording material and means for applying the writing liquid on the opaque recording material in the form of transparent lines wherein said recording material comprises a transparent backing sheet and an opaque layer adhered to one surface of said backing sheet, said opaque layer comprising a finely divided particulate organic styrene resin pigment uniformly distributed throughout a polyvinylidene chloride film-forming resin binder, said writing liquid comprising a solvent for the organic styrene resin pigment, whereby when said writing liquid is applied to said opaque layer according to a pattern of information the opaque layer becomes transparent to visible light according to said pattern.

2. The information recording kit according to claim 1 wherein the weight ratio of styrene resin pigment to film-forming resin binder is in the range of 1:1 to 9:1.

3. The information recording kit according to claim 1 wherein the styrene resin pigment has an average particle diameter size range from about 0.2 microns to about 1.0 microns.

4. The information recording kit according to claim 1, 2 or 3 in which the styrene resin pigment is selected from the group consisting of polystyrene homopolymer and styrene copolymers containing at least 70% by weight of styrene units and up to 30% by weight of another vinyl monomer copolymerizable with styrene.

5. The information recording kit according to claim 1, 2 or 3 in which the writing liquid further comprises a chlorofluoroalkane of the formula $$(CF_xCl_yH_z)—(CF_{x'}Cl_{y'}H_{z'})_n—(CF_{x''}Cl_{y''}H_{z''})_m$$

wherein
n=0 or 1,
x, x', x"=0, 1, 2 or 3
y, y', y"=0, 1, 2 or 3
z, z', z"=0, 1 or 2
when n=0 then m=0 and x+y+z=4,
when n=1 then m=0 or 1,
when n=1 and m=0
then x+y+z=x'+y'+z'=3
and when n=1 and m=1
then x+y+z=x"+y"+z"=3
and x'+y'+z'=2
at a weight ratio of solvent to chlorofluoroalkane of from 10:90 to 80:20.

6. An information recording kit according to claim 5 wherein x≦y, x'≦y' and x"≦y".

7. An information recording kit according to claim 5 wherein the mixture eomprises about 20% to about 50% by weight of the solvent and about 50% to about 80% by weight of the chlorofluoroalkane, based upon the total mixture.

8. An information recording kit according to claim 5 wherein the chlorofluoroalkane is selected from the group consisting of $CFCl_3$, $HCFCl_2$, $Cl_3C—CFCl_2$, $FCl_2C—CCl_2—CClF_2$, $FCl_2C—CClF_2$, $Cl_3C—CF_3$, $F_2ClC—CF_2Cl$, $FCl_2C—CF_3$, $HFClC—CF_2Cl$, $H_2ClC—CF_2Cl$ and $H_2ClC—CF_3$ or mixtures thereof.

9. An information recording kit according to claim 5 wherein the chlorofluoroalkane is $CCl_3F$, $FCCl_2—CCl_2F$ or $CCl_2F—CClF_2$ or mixtures thereof.

10. An information recording kit according to claim 1 in which the solvent is selcted from the group consisting of ketones of the formula

wherein R and R' may be the same or different and are alkyl of 1 to 4 carbon atoms with the proviso that R and R' are not both methyl, alkanoates of the formula

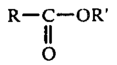

wherein R and R' may be the same or different and are each alkyl groups of 1 to 4 carbon atoms, cellosolve esters, benzene, xylene, toluene chlorinated solvents, dimethyl formamide, dimethylacetamide and tetrahydrofuran.

11. An information recording kit according to claim 1 wherein the solvent is methyl ethyl ketone, ethyl acetate or methylene chloride, methyl isobutyl ketone or butyl acetate.

12. An information recording kit according to claim 1 which further comprises a transparent colored dye in amount sufficient to color the mixture.

13. A method for recording information on an opaque recording material in the form of a transparent pattern corresponding to the information to be recorded which comprises applying, according to a pattern corresponding to the information to be recorded, to an opaque layer, formed from a finely divided styrene resin pigment uniformly distributed in a polyvinylidene chloride film-forming resin binder, adhered to a transparent backing sheet, a writing liquid comprising a solvent for the styrene resin pigment, whereby said opaque layer becomes transparentized in accordance with the pattern by which the writing liquid was applied to thereby form said transparent pattern.

14. The method of claim 13 wherein said solvent further comprises a fluorochloroalkane having a boiling point at atmospheric pressure of greater than 0° C. and having the formula $$(CF_xCl_yH_z)—(CF_{x'}Cl_{y'}H_{z'})_n—(CF_{x''}Cl_{y''}H_{z''})_m$$

wherein
n=0 or 1,
x, x', x"=0, 1, 2 or 3
y, y', y"=0, 1, 2 or 3
z, z', z"=0, 1 or 2
when n=0 then m=0 and x+y+z=4,
when n=1 and m=0 or 1,
when n=1 and m=0
then x+y+z=x'+y'+z'=3
and
when n=1 and m=1
then x+y+z=x"+y"+z"=3
and x'+y'+z'=2
at a weight ratio of solvent to chlorofluoroalkane of from 10:90 to 80:20.

* * * * *